US012645582B2

(12) United States Patent (10) Patent No.: US 12,645,582 B2
Goda et al. (45) Date of Patent: Jun. 2, 2026

(54) DISTURB TRACKING AMONG MULTIPLE ERASE BLOCKS COUPLED TO A SAME STRING

(71) Applicant: Micron Technology, Inc., Boise, ID (US)

(72) Inventors: Akira Goda, Setagaya (JP); Kishore K. Muchherla, San Jose, CA (US); Shyam Sunder Raghunathan, Woodlands (SG); Leo Raimondo, Avezzano (IT); Jung Sheng Hoei, Newark, CA (US); Xiangang Luo, Fremont, CA (US); Ashutosh Malshe, Fremont, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 18/386,746

(22) Filed: Nov. 3, 2023

(65) Prior Publication Data

US 2024/0168878 A1 May 23, 2024

Related U.S. Application Data

(60) Provisional application No. 63/426,167, filed on Nov. 17, 2022.

(51) Int. Cl.
*G06F 12/02* (2006.01)
*G11C 16/34* (2006.01)
(52) U.S. Cl.
CPC ...... *G06F 12/0246* (2013.01); *G11C 16/3418* (2013.01)

(58) Field of Classification Search
CPC ......... G06F 12/0246; G06F 2212/1032; G06F 2212/7204; G06F 2212/7208; G11C 16/0483; G11C 16/349; G11C 16/3418
USPC ....................................................... 711/103
See application file for complete search history.

(56) References Cited

U.S. PATENT DOCUMENTS

| | | | |
|---|---|---|---|
| 7,177,977 B2 | 2/2007 | Chen | |
| 8,542,530 B2 | 9/2013 | Hemink | |
| 9,786,375 B2 | 10/2017 | Goda | |
| 10,229,740 B2 | 3/2019 | Cai | |
| 11,106,532 B1 * | 8/2021 | Singidi ................. | G06F 11/073 |
| 2010/0091571 A1 * | 4/2010 | Park ......................... | G11C 8/08 |
| | | | 365/185.11 |

(Continued)

*Primary Examiner* — Hashem Farrokh
(74) *Attorney, Agent, or Firm* — Brooks, Cameron & Huebsch, PLLC

(57) ABSTRACT

An apparatus can comprise a memory array comprising a plurality of strings of memory cells. Each string of the plurality of strings can comprise: a first group of memory cells coupled to a first group of access lines and corresponding to a first erase block; and a second group of memory cells coupled to a second group of access lines and corresponding to a second erase block. A controller is coupled to the memory array and configured to: perform a programming operation on the first group of memory cells of the first erase block; monitor a quantity of programming and/or erase operations performed on the second group of memory cells subsequent to the programming of the first group of memory cells; and perform an action on the first erase block responsive to the quantity of programming and/or erase operations performed on the second group of memory cells meeting a criteria.

19 Claims, 7 Drawing Sheets

(56) References Cited

U.S. PATENT DOCUMENTS

| 2015/0179254 A1* | 6/2015 | Alrod | G11C 13/0069 |
| | | | 365/148 |
| 2020/0341890 A1* | 10/2020 | Lee | G11C 16/3422 |
| 2022/0051725 A1* | 2/2022 | Yi | G11C 16/08 |
| 2023/0058038 A1* | 2/2023 | Zainuddin | G11C 16/349 |

\* cited by examiner

DISTURB TRACKING AMONG MULTIPLE ERASE BLOCKS COUPLED TO A SAME STRING

PRIORITY INFORMATION

This application claims the benefit of U.S. Provisional Application No. 63/426,167, filed on Nov. 17, 2022, the contents of which are incorporated herein by reference.

TECHNICAL FIELD

Embodiments of the disclosure relate generally to memory systems, and more specifically, relate to apparatuses and methods for disturb tracking among multiple erase blocks coupled to a same string.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
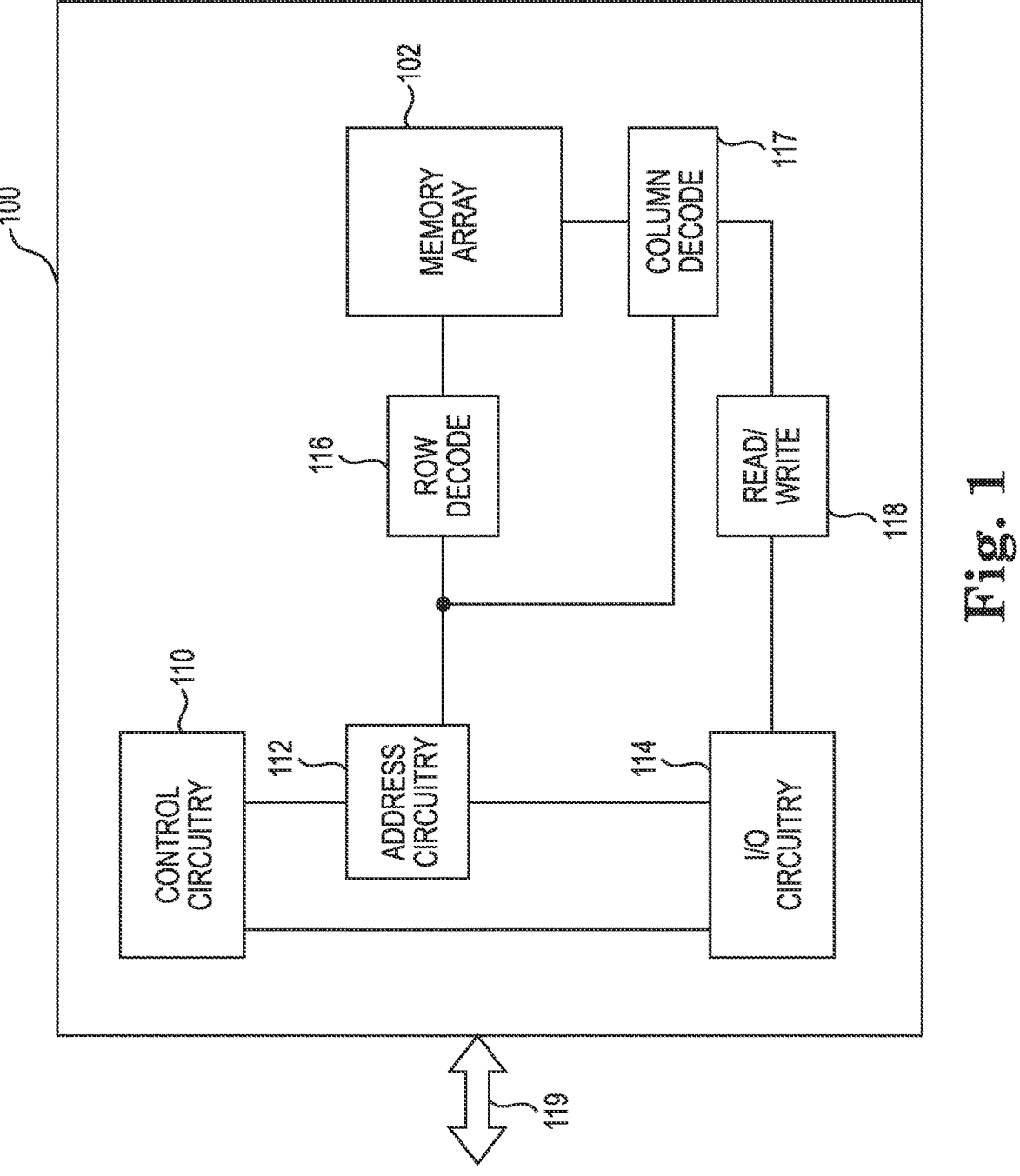
FIG. 1 illustrates an example portion of a memory system including a memory device having and array in accordance with various embodiments of the present disclosure.

Aspects of the present disclosure are directed to apparatuses and methods for disturb tracking among multiple erase blocks coupled to a same string. Various types of memory, such as NAND flash memory, include a memory array of many memory cells that can be arranged in row and column fashion and grouped in physical blocks. The cells can be floating gate transistors that can be programmed to store one more bits by adding charge to the floating gate. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings.

A 3D memory array can comprise multiple blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells of a block while maintaining data in other memory cells of the block.

Some prior approaches that may provide an ability to erase some memory cells of a block while maintaining data in other memory cells of the block can suffer various drawbacks. For example, if a first group of cells within a block share a string with a second group of cells within the same block, program and erase operations performed on the first group of cells can lead to program and/or erase disturb of the second group of cells. Such disturb results in threshold voltage (Vt) shifts of the second group of memory cells, which can result in increased bit error rates (BERs) and/or loss of data.

Various embodiments of the present disclosure address the above and other deficiencies by providing apparatus and methods that can track program and/or erase disturb among multiple erase blocks coupled to a same string. As used herein, an "erase block" refers to a group of cells that are configured to be erased together as a group and that share a same string as one or more additional groups of cells (e.g., one or more additional erase blocks). An erase block may also be referred to as a "deck."

As described further herein, various embodiments can include an apparatus comprising a controller configured to: perform a programming operation on a first group of memory cells of the first erase block that shares a string with a second group of cells of a second erase block; monitor a quantity of programming and/or erase operations performed on the second group of memory cells subsequent to the programming of the first group of memory cells; and perform an action on the first erase block responsive to the quantity of programming and/or erase operations performed on the second group of memory cells meeting a criteria. In various embodiments, the quantity of programming and/or erase operations can correspond to a program/erase (P/E)

cycle count. The action performed in response to the P/E cycle count meeting the criteria can be, for example, a refresh of the first erase block, which can include writing valid data from the first erase block to a different erase block. Alternatively, the action performed can be a scan of the first erase block, which can include reading the data stored in the first erase block to measure its bit error rate (BER), for example. In various embodiments, the criteria to be met can be the P/E cycle count exceeding a threshold count value. For example, the first erase block can be refreshed responsive to a determination that the second erase block has experienced more than a particular quantity (e.g., 100, 200, 1,000, etc.) of P/E cycles since data was programmed to the first erase block. Embodiments are not limited to these examples.

As described further herein, in various embodiments, a number of scaling factors may be used to increment the P/E disturb cycle counter corresponding to a particular victim erase block by differing amounts depending on various criteria. For example, a temperature scaling factor can be employed to increment the P/E disturb cycle counter by different amounts depending on an operating temperature of the memory device. For instance, a P/E cycle performed on an aggressor erase block within a typical operating temperature range can result in a default P/E disturb counter increment of X (with X=1, for example), while a P/E cycle performed on an aggressor erase block outside of a particular operating temperature range (e.g., at a relatively high or low temperature) can result in incrementing the P/E disturb counter in accordance with a temperature scaling factor (e.g., 1.5X, 2X, 3X, etc.) to account for the fact that P/E cycles on the aggressor erase block at different (e.g., extreme) temperatures cause more disturb to the victim erase block than P/E cycles on the aggressor erase block at typical operating temperatures.

Another scaling factor can be employed to increment the P/E disturb cycle counter corresponding to a particular victim erase block by differing amounts depending on the time frame in which P/E cycles are occurring to the aggressor block. For instance, reliability margins corresponding to victim erase blocks can account for both disturb due to P/E cycles occurring on aggressor erase blocks and retention time corresponding to the victim erase blocks (e.g., the reliability margin degrades over time). As such, if the aggressor P/E cycles occur within a relatively short time frame (e.g., in burst mode), then the total reliability margin degradation (due to the summation of degradation due to aggressor P/E cycling and retention degradation) will be reduced as compared to if the same quantity of aggressor P/E cycles were to occur over a longer time period (e.g., since, in the latter case, the reliability margin reduction due retention degradation will be increased). As such, in a number of embodiments, a time period scaling factor can be employed to increment the P/E disturb cycle counter by different amounts depending on a time period over which P/E cycles occur to an aggressor erase block. For instance, if a memory device determines that P/E cycles are being performed on an aggressor erase block in burst mode, then the P/E disturb counter can be incremented in accordance with a time period scaling factor (e.g., 0.8X, 0.5X, 0.3X, etc.) to account for the fact that overall reliability margin degradation corresponding to the victim erase block is reduced as compared to when the same quantity of aggressor P/E cycles occur over a longer time period.

Additionally, in a number of embodiments, different total aggressor P/E cycle count thresholds can be used for different memory devices (e.g., die), which can decrease the likelihood that a scan operation will be unnecessarily performed and/or that an erase block will be unnecessarily refreshed. For example, different memory die can have different degrees of reliability margin (e.g., read window budget (RWB) margins). As such, a majority of die can tolerate more disturb and reliability degradation than the die the tail population. Accordingly, setting static a P/E disturb cycle count threshold based on the weaker die can result in wasting surplus reliability margin on the majority of die. For example, the stronger die (e.g., those having a relatively higher reliability margin) may be able to withstand more than the threshold quantity of P/E disturb cycles before a remedial operation such as a scan or refresh is needed. In a number of embodiments, an initial P/E disturb cycle count threshold can be predetermined and applied for multiple memory devices. The P/E cycle counts that trigger remedial action (e.g., refresh and/or scan operations can be monitored (e.g., on a die by die basis). The outstanding (e.g., surplus) reliability margins during an initial scan can also be monitored and compared with predetermined thresholds. If a remedial action is triggered at the initial P/E cycle count threshold and the surplus reliability margin is above a predetermined threshold, then the P/E disturb cycle count threshold can be increased (e.g., gradually) to account for die behavior in the field. FIG. 1 illustrates an example portion of a memory system including a memory device 100 having and array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 790 described in FIG. 7.

The memory device 100 includes control circuitry 110, address circuitry 112, input/output (I/O) circuitry 114 used to communicate with an external device via an interface 119, which may be a bus used to transmit data, address, and control signals, among other signals between the memory device 100 and an external host device, which can include a controller, host processor, etc., that is capable of accessing the memory array 102. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface; however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations, data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof.

The I/O circuitry 114 is used for bi-directional communication of data between the memory array 102 and the external host via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
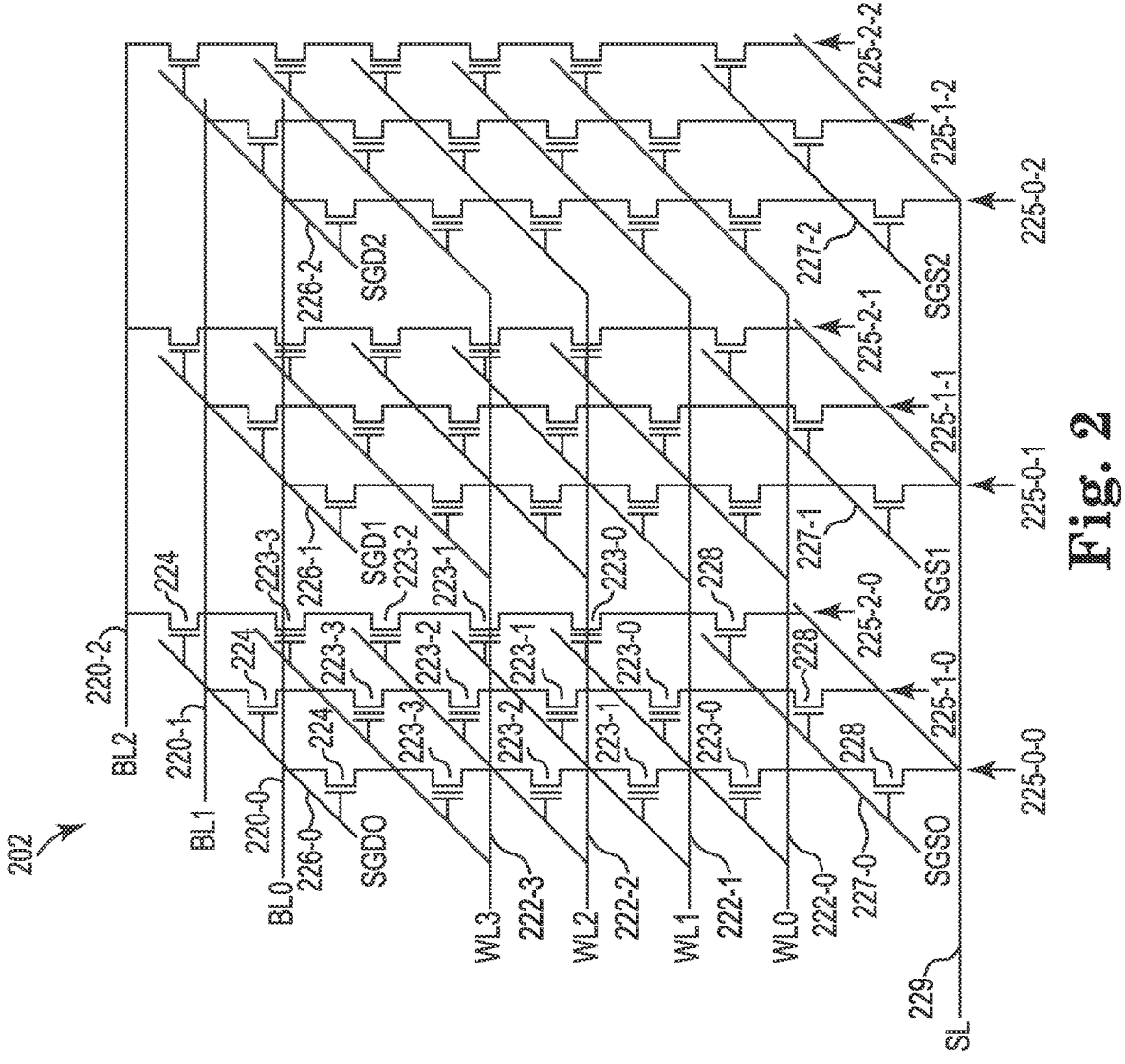
FIG. 2 is a schematic diagram illustrating an example memory array in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 200 is a 3D NAND array.

The memory array 200 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages can be applied to the word lines 222, bit lines 220, and source line 229. The particular voltages applied depends on the memory operation being performed, and different voltages may be applied to the word lines 222 during a particular memory operation in order to store data in a cell (or page of cells) or read data from a cell. For example, a write operation to store data in a selected memory cell 223-2 of string 225-0-0 selected to store information into memory cell 223-2 can involve applying a voltage (e.g., a programming voltage) to the word line 222-2 corresponding to the selected cell 223-2 and other voltages to the word lines (222-0, 222-1, and 222-3) coupled to non-selected cells (222-0, 222-1, and 222-4) (e.g., the memory cells not being programmed). An erase operation to remove data from a selected group of memory cells (e.g., a selected erase block as described further below) can include applying a relatively high voltage (e.g., 20V) to the source line 229, the relatively high voltage (e.g., 20V) to unselected word lines (e.g., word lines coupled to cells of an erase block not being erased), and a relatively low voltage (e.g., 0V) to the selected word lines (e.g., the word lines coupled to the erase block being erased), which results in erasing of the cells of the selected erase block by removing charge from their floating gates and thereby reducing their Vt levels to near 0V, for example.

Figure 3:
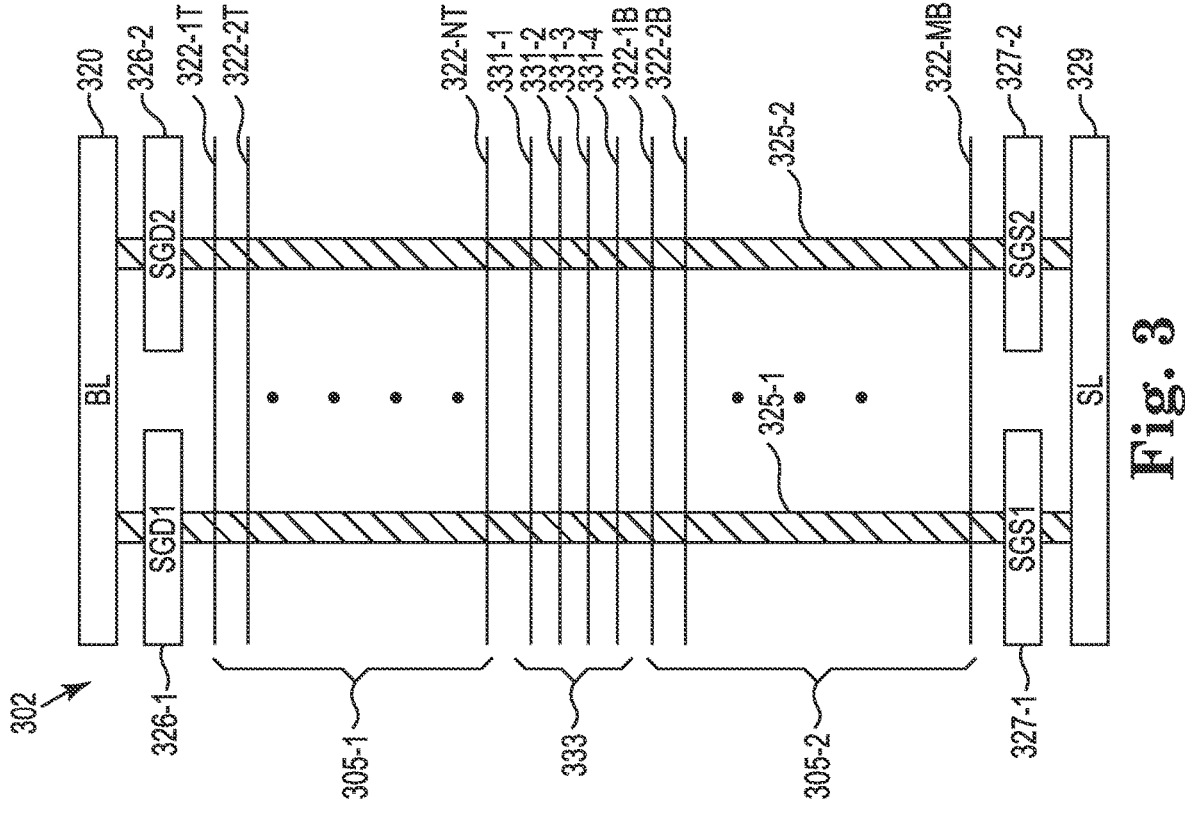
FIG. 3 schematically illustrates a portion of a memory array having multiple erase blocks per string in accordance with various embodiments of the present disclosure.

As described further in FIG. 3, the memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while other erase block(s) corresponding to the same group of strings is deselected (e.g., such that is not erased). As described further herein, erase blocks that have been programmed can experience disturb (e.g., Vt voltage shifts of the constituent cells) when a neighbor erase block (e.g., a different erase block corresponding to the same strings) is programmed and/or erased. Therefore, an erase block that experiences disturb due to programming and/or erase operations performed on a neighbor erase block can be referred to as a "victim" erase block, while the erase block causing the disturb can be referred to as an "aggressor" erase block.

FIG. 3 schematically illustrates a portion of a memory array 302 having multiple erase blocks per string in accordance with various embodiments of the present disclosure. The example shown can be a portion of the array 202 described in FIG. 2. The array portion 302 can be a portion of a physical block of memory cells that includes multiple erase blocks (e.g., decks).

In this example, the array 302 includes a plurality/group of word lines 322-1T, 322-2T, . . . , 322-NT corresponding to a first erase block 305-1 (e.g., a top deck) and a plurality/ group of word lines 322-1B, 322-2B, . . . , 322-MB corresponding to a second erase block 305-2 (e.g., bottom deck). The designators "N" and "M" can represent various numbers (e.g., 3 or more) and "N" and "M" can be the same number. Accordingly, embodiments are not limited to a particular quantity of word lines 322 for the top deck 305-1 or bottom deck 305-2 (the designator "T" corresponding to "top" and the designator "B" corresponding to "bottom"). The array 302 also includes a number of dummy word lines 331-1, 331-2, 331-3, and 331-4, which can be collectively referred to as word lines 331. The dummy word lines 331 correspond to a separation region 333 between the top deck 305-1 and bottom deck 305-2. Although four word lines 331 are illustrated, embodiments can include more or fewer than four dummy word lines 331 separating erase blocks corresponding to same strings.

The array portion 302 illustrates two strings 325-1 and 325-2 for ease of illustration; however, embodiments can include many more strings 325. Memory cells are located at the intersections of the word lines 322/331 and strings 325, with the memory cells of a particular string 325 sharing a common channel region (e.g., pillar) as described in FIG. 2. The dummy word lines 331 can be coupled to dummy memory cells (e.g., cells that are not addressable to store user data).

As illustrated in FIG. 3, a first end of the strings 325-1 and 325-2 can be coupled to a common source line 329 via respective select gate source lines 327-1 (SGS1) and 327-2 (SGS2). The second/opposite end of the strings 325-1 and 325-2 can be coupled to a bit line 320 via respective select gate drain lines 326-1 (SGD1) and 326-2 (SGD2). As such, the strings 325 (e.g., the cells thereof) can be individually accessed using the bit line 320 and select gates to which the lines 326-1 and 326-2 are coupled. Although only a single bit line 320 is shown, embodiments can include multiple bit lines such as shown in FIG. 2, for example.

As noted herein, in various embodiments, the top deck 305-1 and the bottom deck 305-2 can be erased via separate erase operations even though the cells of the decks 305-1/ 305-2 share the same strings 325-1/325-2. For example, an erase operation can be performed on the cells coupled to word lines 322-1T to 322-NT without erasing the cells coupled to the word lines 322-1B to 322-MB, and vice versa. Similarly, each one of the decks 305-1 and 305-2 can be individually programmed and/or read without programming or reading the other of the decks 305-1 and 305-2.

An erase operation performed on a selected deck 305-1, for example, can include applying relatively low voltages to the selected word lines 322-1T to 322-NT, while applying relatively high voltages to the word lines 322-1B to 322-1M of the unselected deck 305-2. The differing voltages between the word lines 322 of different decks can result in unintended Vt shifts of the cells of the unselected deck (e.g., 305-2 in this example). Similar Vt shifts to victim decks can result from programming operations performed on an aggressor deck. The physical separation between the word lines of the top and bottom decks provided by the dummy word lines 331 and/or the bias voltages provided thereto can reduce the Vt shifts experienced by a victim deck (e.g., 305-2); however, repeated erasing and/or programming of an aggressor deck (e.g., 305-1) can result in an accumulation of Vt shifts to cells of the victim deck (e.g., 305-2). Such Vt shifts can become particularly detrimental for decks that store relatively "cold" data that may not be refreshed often via a memory management operation such as a garbage collection operation in which valid data of a deck is moved to a different deck prior to erasing the deck. In such instances, an aggressor deck may experience hundreds or thousands of program/erase cycles while the victim deck stores particular valid data.

As described further below, particularly in association with FIG. 6 and FIG. 7, various embodiments of the present disclosure can monitor the quantity of program operations and/or erase operations performed on an aggressor deck subsequent to a victim deck having been programmed. As an example, a count of P/E cycles can be maintained (e.g., by a controller such as controller 791 shown in FIG. 7) for each victim deck. For example, whenever a deck is programmed, a P/E cycle counter can be reset, and the counter can be incremented for each P/E cycle on the aggressor deck. Responsive to the counter meeting a criteria, such as exceeding a threshold count (e.g., 100 cycles, 500 cycles, 1,000, cycles, etc.), an action can be taken. The action taken can include performing a scan operation on the victim deck to determine whether a BER corresponding to the victim deck is such that the data stored in the victim deck should be moved (e.g., rewritten) to a different deck (e.g., a deck in a different physical block that comprises multiple decks). The action taken can also include a refresh operation in which the data stored in the victim block is rewritten to a different deck before the Vt changes due to the aggressor deck become sufficient to compromise the integrity of the victim deck data.

Figure 4:
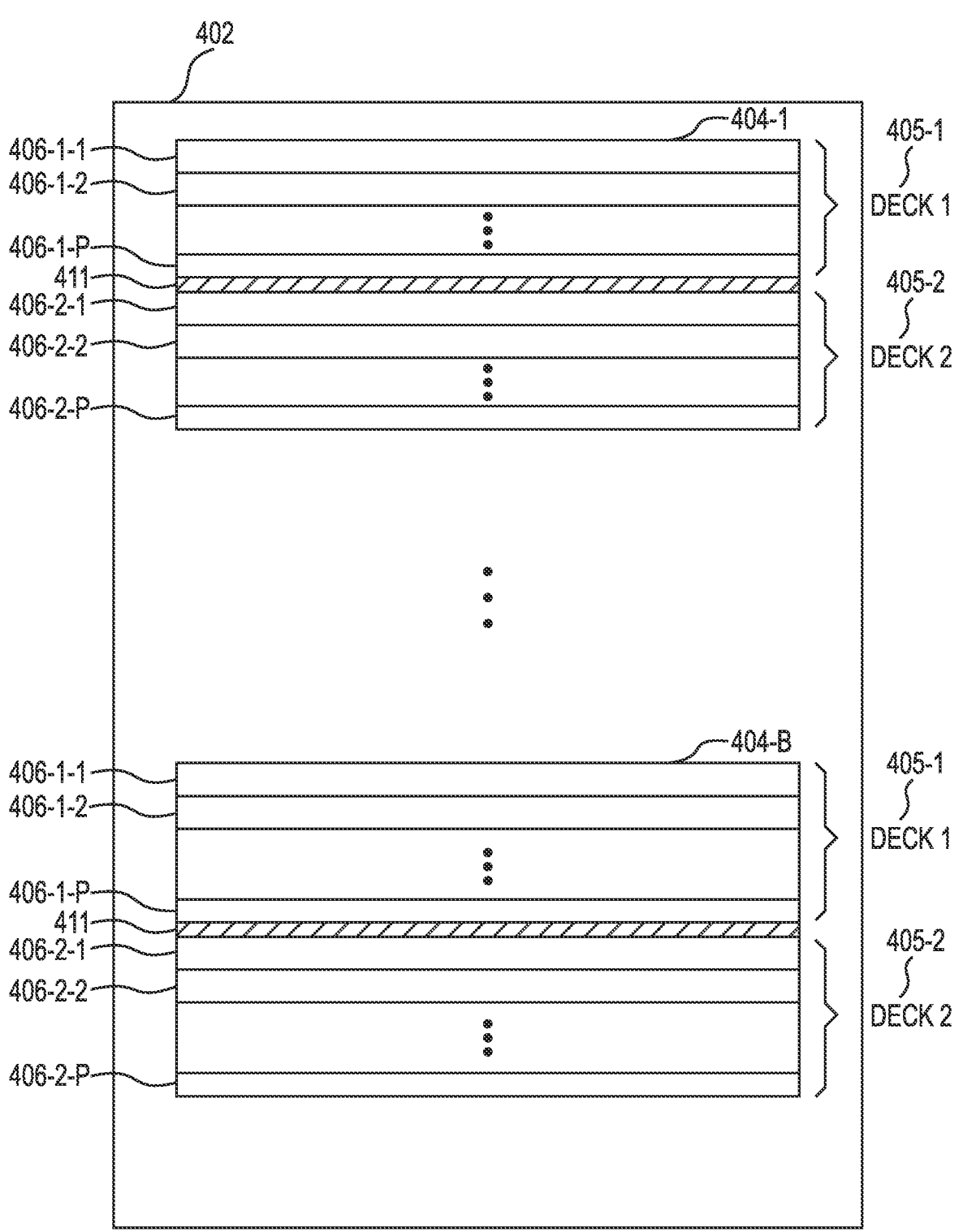
FIG. 4 illustrates a portion of a memory array having multiple erase blocks per string in accordance with various embodiments of the present disclosure.

FIG. 4 illustrates a portion of a memory array 402 having multiple erase blocks per string in accordance with various embodiments of the present disclosure. The memory array 402 includes multiple physical blocks 404-1, . . . , 404-B and can be operated in accordance with one or more embodiments of the present disclosure. The indicator "B" is used to indicate that the array 402 can include a number of physical blocks 404. As an example, the number of physical blocks in array 402 can be 128 blocks, 512 blocks, or 1,024 blocks, but embodiments are not limited to a particular multiple of 128 or to any particular number of physical blocks in an array 402. The memory array 402 can be, for example, a NAND flash memory array (e.g., a 3D NAND flash array such as array 102, 202, and/or 302).

Each of the physical blocks 404-1, . . . , 404-B includes a first erase block 405-1 (DECK 1) and a second erase block 405-2 (DECK 2) separated by a region 411, which can correspond to a region of dummy word lines such as word lines 331 shown in FIG. 3. As described above, the decks 405-1 and 405-2 are commonly coupled to the strings of the blocks 404-1, . . . , 404-B with the decks 405-1 and 405-2 being separately erasable via a block erase operation (e.g., deck 405-1 can be erased without erasing deck 405-2 and vice versa).

Each deck 405-1 and 405-2 can comprise a number of physical pages, which can correspond to a "row" of the array corresponding to a particular word line. As shown, deck 405-1 comprises pages 406-1-1, 406-1-2, . . . , 406-1-P, and deck 405-2 comprises pages 406-2-1, 406-2-2, . . . , 406-2-P. The designator "P" is used to indicate that the decks 405-1 and 405-2 can comprise a plurality of pages/rows. Each physical page (collectively referred to as pages 406) can store multiple logical pages of data. A page can refer to a unit of programming and/or reading (e.g., a group of cells that are programmed and/or read together as a functional group).

Figure 5:
FIG. 5 illustrates a portion of a memory device having multiple erase blocks per string in accordance with various embodiments of the present disclosure.

FIG. 5 illustrates a portion of a memory device having multiple erase blocks per string in accordance with various embodiments of the present disclosure. In various embodiments, the physical blocks of a memory array can be organized into planes. For example, FIG. 5 illustrates memory arrays 502-0, 502-1, 502-3, and 502-4 each divided into a first plane (PLANE 0) of physical blocks and a second plane (PLANE 1) of physical blocks. Embodiments are not limited to a particular quantity of planes per array. Each array 502-0, 502-1, 502-3, and 502-4 corresponds to a respective logical unit (LUN) LUN0, LUN1, LUN2, and LUN3. Each LUN can correspond to a different memory device (e.g., memory device 100 shown in FIG. 1); however, embodiments are not so limited. For example, a memory device (e.g., die) can include multiple LUNs. A LUN can, for example, correspond to a smallest unit that can independently execute commands and report status.

The physical blocks of the planes can comprise multiple erase blocks sharing common strings as described herein. The physical blocks can be grouped into "super blocks" with each super block comprising a physical block from each plane (e.g., PLANE 0 and PLANE 1) across multiple LUNs (e.g., across multiple arrays 502). Similarly, embodiments of the present disclosure an include a number of super decks 515-1 (SUPER DECK 1), 515-2 (SUPER DECK 2), . . . , 515-D (SUPER DECK D). Each super deck (or super erase block) 515 can comprise a deck from each plane across multiple LUNs. For example, a first super deck 515-1 (SUPER DECK 1) can comprise a deck from plane 0 of LUN0, a deck from plane 1 of LUN1, a deck from plane 0 of LUN1, a deck from plane 1 of LUN1, a deck from plane 0 of LUN2, a deck from plane 1 of LUN2, a deck from plane 0 of LUN3, and a deck from plane 1 of LUN3.

Embodiments of the present disclosure can monitor program and/or erase disturb on a super deck level as well as, or instead of, on a deck level. For instance, consider an example in which the constituent decks of a super deck 515-1 share common strings with the respective constituent decks of a super deck 515-2 (e.g., super decks 515-1 and 515-2 are located in a same physical super block). The decks of super deck 515-1 can be erased together as a group and therefore can be considered an aggressor super deck since the erase operation thereon can contribute to erase disturb on each of the victim decks of the corresponding victim super deck 515-2. In various embodiments, a count of aggressor erase and/or program operations can be maintained on a deck level and/or on a super deck level.

Figure 6:
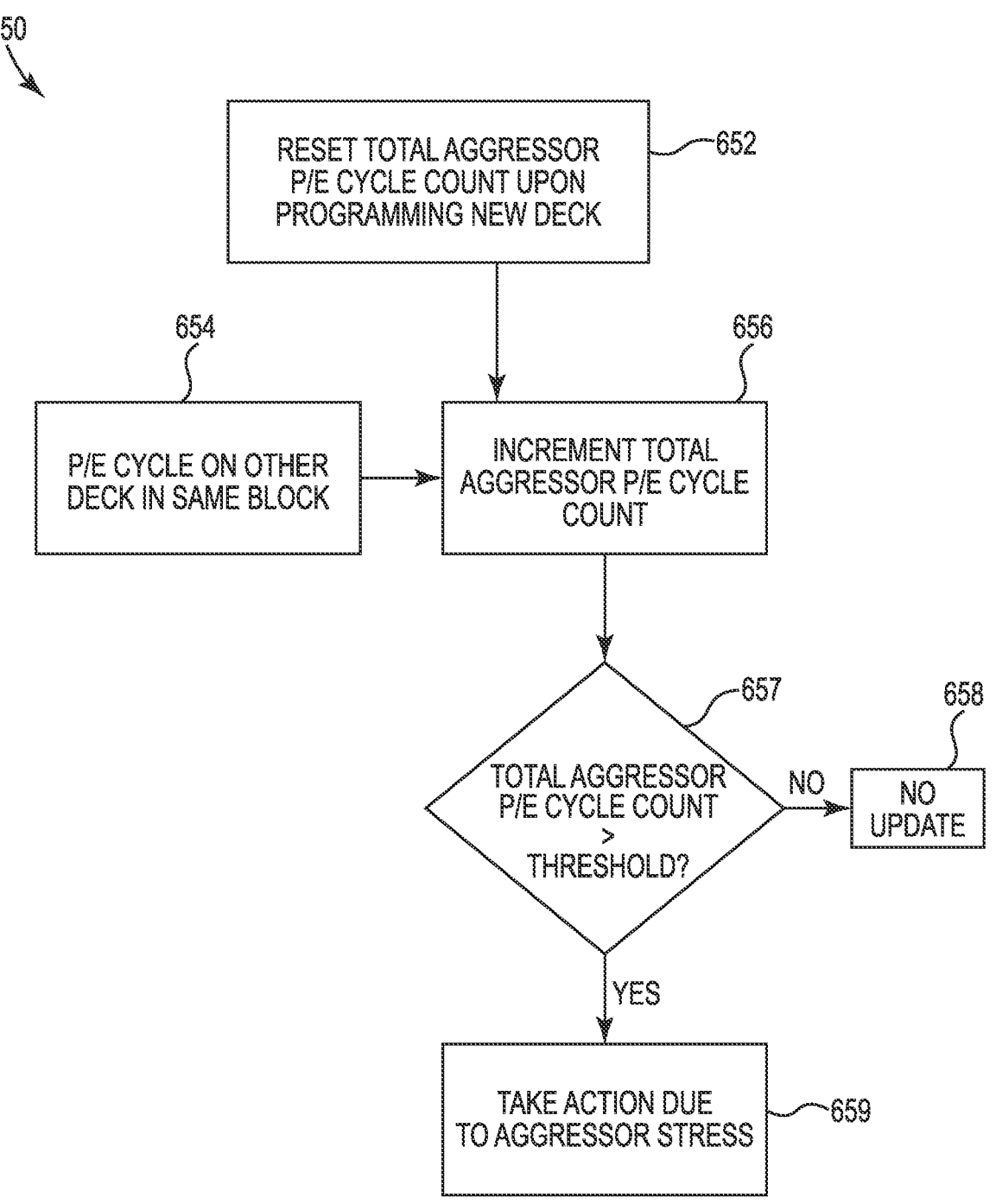
FIG. 6 is a flow diagram that illustrates an example method for tracking disturb among multiple erase blocks coupled to a same string in accordance with various embodiments of the present disclosure.

FIG. 6 is a flow diagram that illustrates an example method 650 for tracking disturb among multiple erase blocks coupled to a same string in accordance with various embodiments of the present disclosure. The method 650 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 650 is performed by the control circuitry 110 of FIG. 1 and/or the controller 791 of FIG. 7. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 652, the method 650 includes resetting a total aggressor P/E cycle count upon programming a new deck. The deck can be a deck such as various decks (e.g., erase blocks) described above (e.g., decks 305-1/305-2, 405-1/405-2, or a super deck 515-1, 515-2, . . . , 515-D). The newly programmed deck becomes a victim deck until it is subsequently erased.

At block 654, a deck that shares a string with the victim deck undergoes a P/E cycle. Any deck that shares a string with the victim deck can be considered an aggressor deck since a program operation or erase operation performed on any deck other than the victim deck that is coupled to the same strings as the victim deck can result in disturb to the programmed cells of the victim deck (e.g., in the form of a Vt shift of the programmed cells).

At block 656, the method includes incrementing the total aggressor P/E cycle count corresponding to the victim deck for each P/E cycle experienced by an/any aggressor deck. In various embodiments, a number of scaling factors may be used to increment the P/E disturb cycle counter corresponding to a particular victim erase block by differing amounts depending on various criteria. For example, a temperature scaling factor can be employed to increment the P/E disturb cycle counter by different amounts depending on an operating temperature of the memory device. For instance, a P/E cycle performed on an aggressor erase block within a typical operating temperature range can result in a default P/E disturb counter increment of X (with X=1, for example), while a P/E cycle performed on an aggressor erase block outside of a particular operating temperature range (e.g., at a relatively high or low temperature) can result in incrementing the P/E disturb counter in accordance with a temperature scaling factor (e.g., 1.5X, 2X, 3X, etc.) to account for the fact that P/E cycles on the aggressor erase block at different (e.g., extreme) temperatures cause more disturb to the victim erase block than P/E cycles on the aggressor erase block at typical operating temperatures.

Another scaling factor can be employed to increment the P/E disturb cycle counter corresponding to a particular victim erase block by differing amounts depending on the time frame in which P/E cycles are occurring to the aggressor block. For instance, reliability margins corresponding to victim erase blocks can account for both disturb due to P/E cycles occurring on aggressor erase blocks and retention time corresponding to the victim erase blocks (e.g., the reliability margin degrades over time). As such, if the aggressor P/E cycles occur within a relatively short time frame (e.g., in burst mode), then the total reliability margin degradation (due to the summation of degradation due to aggressor P/E cycling and retention degradation) will be reduced as compared to if the same quantity of aggressor P/E cycles were to occur over a longer time period (e.g., since, in the latter case, the reliability margin reduction due retention degradation will be increased). As such, in a number of embodiments, a time period scaling factor can be employed to increment the P/E disturb cycle counter by different amounts depending on a time period over which P/E cycles occur to an aggressor erase block. For instance, if a memory device determines that P/E cycles are being performed on an aggressor erase block in burst mode, then the P/E disturb counter can be incremented in accordance with a time period scaling factor (e.g., 0.8X, 0.5X, 0.3X, etc.) to account for the fact that P/E cycle disturb on the victim erase block per P/E cycle on the aggressor erase block in burst mode is reduced as compared to P/E cycles on the aggressor erase block performed over a longer time period.

At block 657 it is determined whether the total aggressor P/E cycle count corresponding to the victim deck exceeds a threshold count, which can be a value such as 100, 200, 500, etc. In various embodiments, the threshold count can vary on a memory device by memory device (e.g., die by die) basis. For example, a memory device with a higher reliability margin (e.g., RWB margin) can have a higher corresponding threshold count than a memory device with a lower reliability margin. In some embodiments, all memory devices may have a same initial threshold count, which can be predetermined. The initial threshold count can be adjusted/updated based on the P/E cycle count that actually results in (e.g., triggers) a remedial action. In a number of embodiments, a surplus reliability margin can be determined when the threshold count is reached and/or when a remedial action is taken in response thereto. If the surplus reliability margin is above a threshold margin, then the threshold count can be adjusted (e.g., increased) to account for the fact a victim deck can undergo a greater quantity of aggressor P/E cycles prior to requiring a refresh and/or scan operation, for example.

If the total P/E cycle count does not yet exceed the threshold count, then no action is taken, as illustrated at block 658. However, if the total aggressor P/E cycle count corresponding to the victim deck exceeds the threshold count, then an action due to the aggressor deck stress on the victim deck is taken as illustrated at block 659. As described above, various actions can be taken responsive to the total aggressor P/E cycle count corresponding to the victim deck exceeding the threshold count. One example includes a refresh operation in which the data corresponding to the victim deck is moved (e.g., rewritten) to a different deck (e.g., in a different physical block). Upon being rewritten to the different/new deck, the method 650 can begin anew with the new deck now becoming a new victim deck and the total aggressor P/E cycle count corresponding to the new deck can be reset. It is noted that the programming operation performed on the new deck also makes the new deck an aggressor deck for any other decks with which it shares strings.

Another action that can be taken responsive to a total aggressor P/E cycle count corresponding to a particular victim deck exceeding the threshold count is performing a scan operation on the victim deck. The scan operation can include reading the memory cells (e.g., pages) of the victim deck. For example, a BER can be determined based on the read operation(s), and a determination can be made regarding whether the data stored in the victim deck should be moved to a new/different deck.

Figure 7:
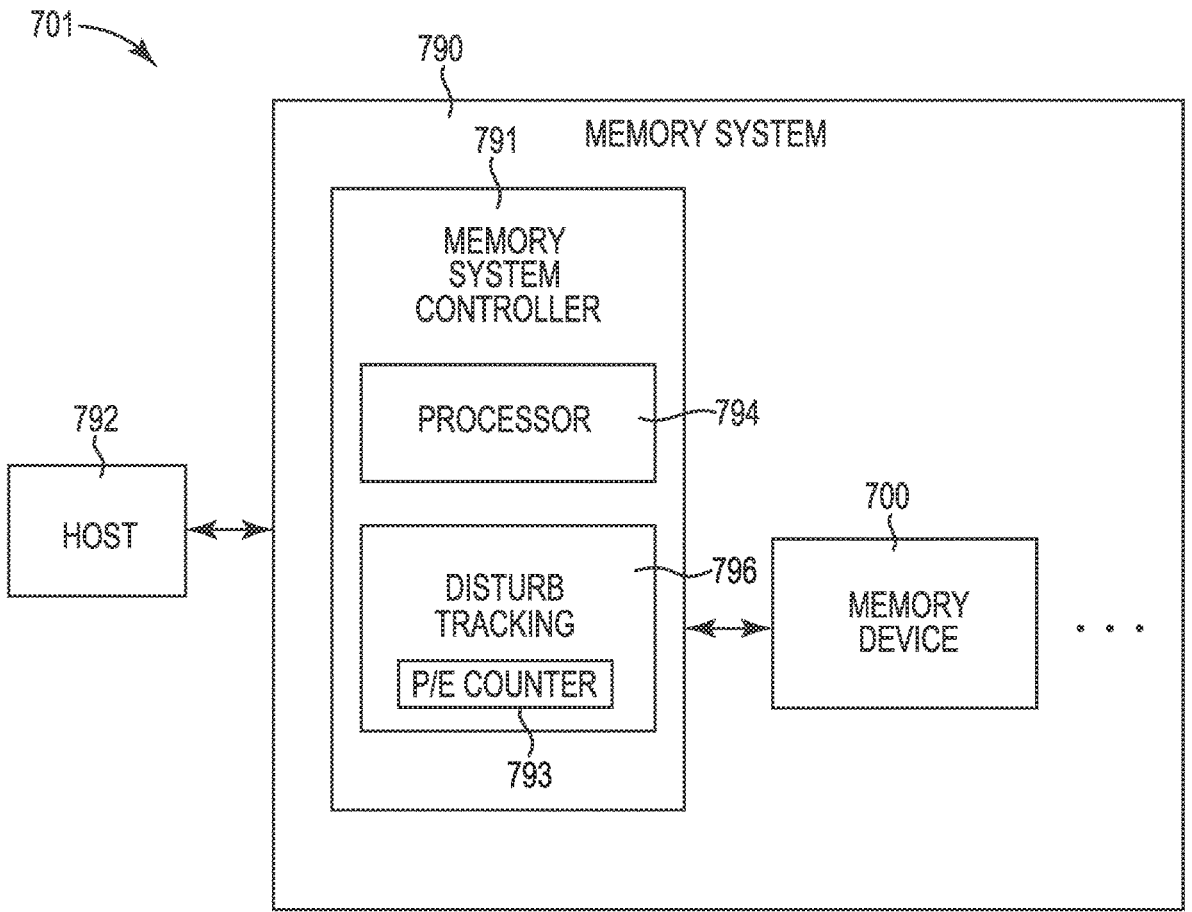
FIG. 7 illustrates an example computing system having a memory system for performing disturb tracking among multiple erase blocks coupled to a same string in accordance with various embodiments of the present disclosure.

FIG. 7 illustrates an example computing system 701 having a memory system 790 for performing disturb tracking among multiple erase blocks coupled to a same string in accordance with various embodiments of the present disclosure. As shown in FIG. 7, the memory system 790 includes a system controller 791 and a number of memory devices 700, which can be memory devices such as device 100 described in FIG. 1 (e.g., memory devices comprising memory arrays having multiple erase blocks coupled to common strings).

In some embodiments, the memory system 790 is a storage system. An example of a storage system is a solid-state drive (SSD). In some embodiments, the memory system 790 is a hybrid memory/storage sub-system. In general, the computing environment shown in FIG. 7 can include a host system 792 that uses the memory system 790. For example, the host system 792 can write data to the memory system 790 and read data from the memory system 790.

The memory system controller 791 (hereinafter referred to as "controller") can communicate with the memory devices 700 to perform operations such as reading data, writing data, or erasing data at the memory devices 700 and other such operations. The controller 791 can include hardware such as one or more integrated circuits and/or discrete components, a buffer memory, or a combination thereof. The controller 791 can include a microcontroller, special purpose logic circuitry (e.g., a field programmable gate array (FPGA), an application specific integrated circuit (ASIC), etc.), or other suitable processing circuitry. The controller 791 can include a processing device (e.g., processor 794) configured to execute instructions stored in local memory (not shown).

In this example, the controller 791 includes a disturb tracking component 796 that can be responsible for monitoring program and/or erase disturb experienced by victim decks due to program and/or erase operations performed on aggressor decks as described herein. As shown in FIG. 7, the disturb tracking component can include a P/E cycle counter 793. Although a single P/E cycle counter is illustrated, embodiments can include multiple P/E cycle counters 793 corresponding to respective victim decks. The counter 793 can maintain a total aggressor P/E cycle count for a victim deck which can be incremented each time an aggressor deck is programed and/or erased.

The tracking component 796 can, for example, reset a particular P/E cycle counter once a particular deck is newly programmed and can proceed to increment the P/E cycle counter for subsequent programs/erases to aggressor decks corresponding to the newly programmed (e.g., victim deck). The tracking component 796 and/or processor 794 can also take the various actions responsive to the aggressor stress on a victim deck exceeding a threshold level, as indicated by the corresponding total aggressor P/E cycle count, for example.

In general, the controller 791 can receive commands or operations from the host system 792 and can convert the commands or operations into instructions or appropriate commands to achieve the desired access to the memory devices 700. The controller 791 can be responsible for other operations such as wear leveling operations, garbage collection operations, error detection and error-correcting code (ECC) operations, encryption operations, caching operations, and address translations between a logical block address and a physical block address that are associated with the memory devices 700.

The host system 792 can be a computing device such as a desktop computer, laptop computer, network server, mobile device, or other such computing device that includes a memory and a processing device. The host system 792 can include, or be coupled to, the memory system 790 so that the host system 792 can read data from or write data to the memory system 790. The host system 792 can be coupled to the memory system 790 via a physical host interface (not shown in FIG. 7). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 792 and the memory system 790. The host system 792 can further utilize an NVM Express (NVMe) interface to access the memory devices 700 when the memory system 790 is coupled with the host system 792 by the PCIe interface. The physical host interface can provide an interface for passing control, address, data, and other signals between the memory system 790 and the host system 792.

While the example memory system 790 in FIG. 7 has been illustrated as including the controller 791, in another embodiment of the present disclosure, a memory system 790 may not include a controller 791, and can instead rely upon external control (e.g., provided by a processor or controller separate from the memory system 790, such as by host 792 communicating directly with the memory devices 700).

Although the memory system 790 is shown as physically separate from the host 792, in a number of embodiments the memory system 790 can be embedded within the host 792. Alternatively, the memory system 790 can be removable from the host 792.

As used herein, an "apparatus" can refer to various structural components. For example, the computing system 701 shown in FIG. 7 can be considered an apparatus. Alternatively, the host 792, the controller 791, and the memory device 700 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory array comprising a plurality of strings of memory cells, wherein each string of the plurality of strings comprises:
a first group of memory cells coupled to a first group of access lines and corresponding to a first erase block; and
a second group of memory cells coupled to a second group of access lines and corresponding to a second erase block; and
a controller coupled to the memory array and configured to:
perform a programming operation on the first group of memory cells of the first erase block;
monitor a quantity of programming and/or erase operations performed on the second group of memory cells subsequent to the programming of the first group of memory cells; and perform an action on the first erase block responsive to the quantity of programming and/or erase operations performed on the second group of memory cells meeting a criteria; and wherein the apparatus further comprises a counter used to monitor program/erase (P/E) disturb; and wherein the controller is further configured to increment the counter in accordance with a scaling factor.

2. The apparatus of claim 1, wherein each string of the plurality of strings further comprises a third group of access lines located between the first group of access lines and the second group of access lines.

3. The apparatus of claim 2, wherein the third group of access lines are dummy access lines coupled to memory cells that are not used to store user data.

4. The apparatus of claim 1, wherein the criteria is the quantity of programming and/or erase operations exceeding a threshold quantity.

5. The apparatus of claim 1, wherein:
the plurality of strings is a first plurality of strings, and wherein the memory array comprises a second plurality of strings, wherein each string of the second plurality of strings comprises:
a third group of memory cells coupled to a third group of access lines and corresponding to a third erase block; and
a fourth group of memory cells coupled to a fourth group of access lines and corresponding to a fourth erase block; and
the action comprises performing a refresh operation on the first group of memory cells that includes copying contents of the first group of memory cells to the third erase block.

6. The apparatus of claim 1, wherein the scaling factor is based on:
an operating temperature of the memory array; and
a time period over which the quantity of programming and/or erase operations are performed on the second group of memory cells subsequent to the programming of the first group of memory cells.

7. The apparatus of claim 1, wherein the memory array is a three dimensional (3D) array of NAND flash memory cells with the first group of memory cells and the second group of memory cells of the first string sharing a common channel region.

8. The apparatus of claim 1, wherein the plurality of strings is a first plurality of strings, and wherein the memory array comprises a second plurality of strings, wherein each string of the second plurality of strings comprises:
a third group of memory cells coupled to a third group of access lines and corresponding to a third erase block; and
a fourth group of memory cells coupled to a fourth group of access lines and corresponding to a fourth erase block; and
wherein the first erase block and the second erase block correspond to a first physical block of the memory array;
wherein the third erase block and the fourth erase block correspond to second physical block of the memory array, wherein the first physical block and the second physical block are different physical blocks; and
wherein the first, second, third, and fourth erase blocks correspond to a logical block size that is smaller than a size of the first and second physical blocks.

9. A method, comprising:
programming a first group of memory cells of a first string of memory cells of a memory array comprising a plurality of strings, wherein the first string comprises:
the first group of memory cells coupled to a first group of access lines and corresponding to a first erase block; and
a second group of memory cells coupled to a second group of access lines and corresponding to a second erase block;
monitoring a quantity of program/erase (P/E) cycles performed on the second erase block since the programming of the first group of memory cells; and
responsive to the quantity of P/E cycles meeting a criteria, performing an action on the first erase block to account for disturb experienced by the first group of memory cells resulting from the P/E cycles performed on the second erase block;
wherein monitoring the quantity of P/E cycles includes maintaining a P/E cycle count, and wherein the quantity of P/E cycles meeting the criteria corresponds to the P/E cycle count performed on the second erase block exceeding a threshold P/E cycle count; and
wherein the method further comprises:
determining a reliability margin corresponding to the first erase block when the action is performed on the first erase block; and
increasing the threshold P/E cycle count responsive to determining that the reliability margin is greater than a threshold margin.

10. The method of claim 9, wherein the first group of access lines corresponding to the first erase block are physically separated from the second group of access lines corresponding to the second erase block by a number of access lines coupled to memory cells that are not used to store data.

11. The method of claim 9, wherein the method further comprises:
performing an erase operation on the first erase block; and
resetting a counter used to monitor the quantity of P/E cycles performed on the second erase block responsive to a subsequent programming operation performed on the first erase block.

12. An apparatus, comprising:
a memory array comprising a plurality of physical blocks of memory cells, each physical block of memory cells of the plurality of physical blocks comprising a plurality of strings of memory cells, wherein a first string of the plurality of strings corresponds to multiple erase blocks of a particular physical block that are erasable at different times, and wherein the first string comprises:
a first group of memory cells coupled to a first group of access lines and corresponding to a first erase block of the multiple erase blocks; and
a second group of memory cells coupled to a second group of access lines and corresponding to a second erase block; and
a number of dummy access lines separating the first group of access lines from the second group of access lines; and
a controller coupled to the memory array and configured to monitor an amount of disturb experienced by the first erase block due to program/erase (P/E) cycles performed on the second erase block by:
incrementing a disturb counter corresponding to the first erase block for each P/E cycle experienced by the second erase block subsequent to programming of the first erase block; and performing an action on the first erase block responsive to the disturb counter exceeding a threshold count.

13. The apparatus of claim 12, wherein the first group of memory cells are configured to be erased without erasing the second group of memory cells.

14. The apparatus of claim 12, wherein the controller is configured to perform a scan operation on the first erase block or a refresh operation on the first erase block responsive to the disturb counter exceeding the threshold count.

15. The apparatus of claim 12, wherein the number of dummy access lines comprises at least two dummy access lines.

16. The apparatus of claim 12, wherein the controller comprises a disturb tracking component configured to increment the disturb counter corresponding to the first erase block for each P/E cycle experienced by the second erase block subsequent to programming of the first erase block.

17. The apparatus of claim 12, wherein the apparatus comprises a storage device and the memory array comprises a three dimensional (3D) NAND array.

18. An apparatus, comprising:
a memory array comprising a plurality of strings of memory cells, wherein each string of the plurality of strings comprises:
a first group of memory cells coupled to a first group of access lines and corresponding to a first erase block; and
a second group of memory cells coupled to a second group of access lines and corresponding to a second erase block; and
a controller coupled to the memory array and configured to:
perform a programming operation on the first group of memory cells of the first erase block;
monitor a quantity of programming and/or erase operations performed on the second group of memory cells subsequent to the programming of the first group of memory cells; and perform an action on the first erase block responsive to the quantity of programming and/or erase operations performed on the second group of memory cells meeting a criteria;
wherein the apparatus further comprises a counter used to monitor program/erase (P/E) disturb; and
wherein the controller is further configured to increment the counter in accordance with a scaling factor based on one or both of:
an operating temperature of the memory array; and
a time period over which the quantity of programming and/or erase operations are performed on the second group of memory cells subsequent to the programming of the first group of memory cells.

19. A method, comprising:
programming a first group of memory cells of a first string of memory cells of a memory array comprising a plurality of strings, wherein the first string comprises:
the first group of memory cells coupled to a first group of access lines and corresponding to a first erase block; and
a second group of memory cells coupled to a second group of access lines and corresponding to a second erase block;
monitoring a quantity of program/erase (P/E) cycles performed on the second erase block since the programming of the first group of memory cells; and
responsive to the quantity of P/E cycles meeting a criteria, performing an action on the first erase block to account for disturb experienced by the first group of memory cells resulting from the P/E cycles performed on the second erase block;
performing an erase operation on the first erase block; and
resetting a counter used to monitor the quantity of P/E cycles performed on the second erase block responsive to a subsequent programming operation performed on the first erase block.

* * * * *